United States Patent [19]

Gruss et al.

[11] Patent Number: 5,107,103
[45] Date of Patent: Apr. 21, 1992

[54] INTEGRATED CIRCUIT HAVING AT LEAST A SENSOR AND A PROCESSOR THEREON

[75] Inventors: Andrew Gruss; Takeo Kanade, both of Pittsburgh; L. Richard Carley, Murrysville, all of Pa.

[73] Assignee: Carnegie-Mellon University, Pittsburgh, Pa.

[21] Appl. No.: 470,818

[22] Filed: Jan. 26, 1990

[51] Int. Cl.⁵ .............................................. H01J 40/14
[52] U.S. Cl. .................. 250/208.3; 250/206.1
[58] Field of Search ............... 250/208.3, 561, 208.1, 250/208.2, 206.1, 206.2; 356/4, 375, 218, 222, 223, 226, 215

[56] References Cited

U.S. PATENT DOCUMENTS

| | | | |
|---|---|---|---|
| 4,093,866 | 6/1978 | Kasdan et al. | 250/208.3 |
| 4,511,248 | 4/1985 | Abbas | 356/4 |
| 4,864,515 | 9/1989 | Deck | 356/4 |
| 4,902,886 | 2/1990 | Smisko | 250/208.3 |
| 4,929,824 | 5/1990 | Miyazaki | 250/208.3 |
| 4,931,661 | 6/1990 | Fukaya et al. | 250/208.1 |
| 4,980,546 | 12/1990 | Berger | 250/208.1 |

*Primary Examiner*—David C. Nelms
*Attorney, Agent, or Firm*—Ansel M. Schwartz

[57] ABSTRACT

The present invention pertains to an integrated circuit. The integrated circuit comprises a sensor which produces a sensor signal corresponding to energy received. The integrated circuit is also comprised of a processing element connected to the sensor which receives the sensor signal only from the sensor and produces a processing signal corresponding to the sensor signal. Additionally, there is a memory connected to the processing element for receiving the processing signal and storing the processing signal. In a preferred embodiment, the integrated circuit is also comprised of a buffer connected to the sensor and the processing element for receiving the sensor signal and buffering the sensor signal for reception by the processing element. The sensor can include a photodiode which receives the sensor signal corresponding to light energy it receives. In a more preferred embodiment, the integrated circuit includes a photosensitive array comprised of cells for use in a light stripe rangefinder wherein a plane of light is moved across a scene. Each cell is able to detect and remember the time in which it observes the light intensity thereon.

55 Claims, 3 Drawing Sheets

INTEGRATED CIRCUIT HAVING AT LEAST A SENSOR AND A PROCESSOR THEREON

FIELD OF THE INVENTION

The present invention is related to an integrated circuit that has the capability of sensing, processing and remembering. More specifically, the present invention is related to an integrated circuit that can be used in a structured light rangefinder, in particular, a lightstripe rangefinder using a continuously sweeping stripe.

BACKGROUND OF THE INVENTION

Rangefinding, the measurement of the 3D profile of an object or scene, is a critical component for many robotic applications. Of the many rangefinding techniques that have been developed, see P. J. Besl. Range Imaging Sensors. Research Publication GMR-6090, General Motors Research Laboratories, Mar. 15, 1988, lightstripe rangefinding remains one of the most widely used and reliable methods available. In a conventional lightstripe system, a complete range map is obtained via the step-and-repeat process of projecting a stripe, grabbing a camera image, extracting the projected stripe positions, and stepping the stripe until an entire scene has been scanned. Though practical, the speed of sampling range data with this conventional technique is severely limited.

FIG. 4 shows the geometrical principle on which a lightstripe rangefinder operates. The scene is illuminated with a vertical plane of light. The light is intercepted by an object surface in the path of the beam and, when seen by a video camera placed to the left of the light source, appears as a stripe which follows the surface contour of objects in the scene.

Range data along the contour can be calculated easily using the principle of triangulation. In FIG. 4, the equation of the plane of light L is known because the projection angle $\theta$ is controlled. The line of sight R for each point p on the image of the stripe can also be determined by tracing a line from the image focal point $f_p$ through p. The intersection of the ray R with the plane L uniquely determines the three-dimensional position of P on the surface corresponding to p.

A conventional step-and-repeat rangefinder collects range data for an entire scene sequentially—iterating the process of fixing the stripe on the scene, taking a picture, and processing the resultant image until the entire scene has been scanned.

Though practical, the speed of sampling range data by the conventional light stripe technique is severely limited. Assume that a video camera image has N rows. Since from one image at each step there can be obtained up to N data points, the maximum speed of sampling being $S_{max} = N/T_f$ is the time required to acquire and process an image frame. Typically, N ranges between 256 and 512 samples and $T_f$ ranges between 1/30 second and 1/10 second. Thus, sampling speeds of camera based systems are limited to $$S_{max} \approx 2.5k - 15k \text{samples/second}.$$

The algorithm used by a lightstripe rangefinder implemented with the present invention is based on the lightstripe ranging technique in a manner described by Sato, see Y. Sato, K. Araki, and S. Parthasarathy. High speed rangefinder. SPIE, 1987, and Kida, see T. Kida, K. Sato, and S. Inokuchi. Realtime range imaging sensor. In Proceedings 5th Sensing Forum, pages 91-95, April 1988. In Japanese.

The lightstripe rangefinder of the present invention utilizes a photosensitive array of cells on an integrated circuit to derive range information from a structured light source. Sampling speeds of $$S_{max}^{Smart} = \frac{M^2}{T_s} \approx 0.2 - 10 \text{ Msamples/second}$$

can be achieved. $M^2$ represents the total number of sensors in the overall system, and $T_s$ represents the time to acquire data.

One of the aspects of the present invention which accomplish this several orders of magnitude sampling speed increase is the ability to sweep the lightstripe continuously across a scene, with the photosensitive array receiving information from the sweeping lightstripe and processing this information.

The present invention is directed to an array of cells, each of which provides for the ability to integrate memory, and processing into each cell. Examples of this class of chip exist and include commercial CCD image chips, the Xerox Optical Mouse, see R. F. Lyon. The Optical Mouse, and an Architectural Methodology for Smart Digital Sensors. Technical Report VLSI-81-1, Xerox Palo Alto research Center, August 1981, Mead's Artificial Retina, see M. A. Sivilotti, M. A. Mahowald, and C. A. Mead. Real-time visual computations using analog cmos processing arrays. In P. Losleben, editor, Advanced research in VLSI—Proceedings of the 1987 Stanford Conference, pages 295-312. The MIT Press, 1987, and an Optical Position Encoder done at the CSEM in Switzerland, see P. Aubert and H. Oguey. An application specific integrated circuit (asic) with cmos-compatible light sensors for an optical position encoder. In IEEE 1987 Custom Integrated Circuits Conference, pages 712-716, IEEE, May 1987. However, none of these have the one-to-one relationship existing between the sensor, processing and memory circuitry necessary to achieve the desired results.

SUMMARY OF THE INVENTION

The present invention pertains to an integrated circuit. The integrated circuit comprises a sensing element which produces a signal corresponding to energy received. The integrated circuit is also comprised of a processing element connected to the sensor which receives the sensor signal only from the sensor and produces a processing signal corresponding to the sensor signal. Additionally, there is a memory connected to the processing element for receiving the processing signal and storing the processing signal. In a preferred embodiment, the integrated circuit is also comprised of a buffer connected to the sensor and the processing element for receiving the sensor signal and buffering the sensor signal for reception by the processing element. The sensor can include a photodiode which receives the sensor signal corresponding to light energy it receives.

In a more preferred embodiment, the integrated circuit includes a photosensitive array comprised of cells for use in a light stripe rangefinder wherein a plane of light is moved across a scene. Each cell is able to detect and remember the time in which it observes the a predetermined light intensity thereon.

BRIEF DESCRIPTION OF THE DRAWINGS

In the accompanying drawings, the preferred embodiments of the invention and preferred methods of practicing the invention are illustrated in which.

DESCRIPTION OF THE PREFERRED EMBODIMENT

Figure 1:
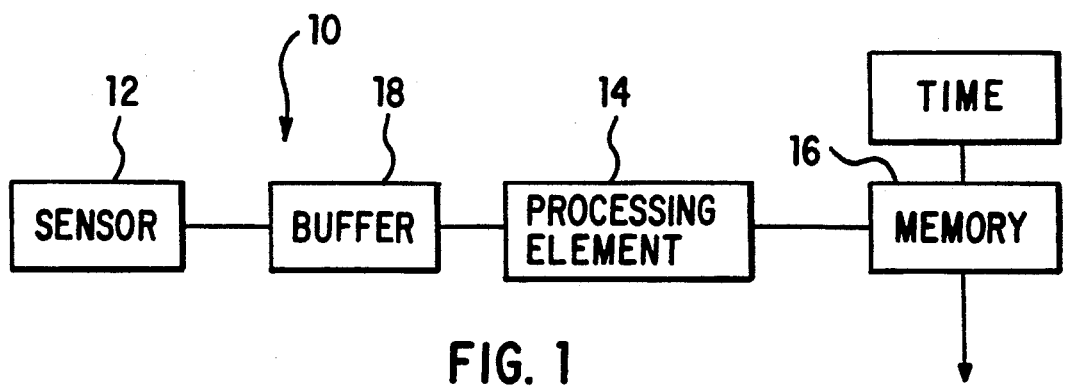
FIG. 1 is a schematic representation of an integrated circuit of the present invention.

Referring now to the drawings wherein like reference numerals refers to similar or identical parts throughout the several views, and more specifically to FIG. 1 thereof, there is shown a schematic representation of an integrated circuit 10. The integrated circuit 10 is comprised of a sensor 12 which produces a sensor signal corresponding to energy it receives. The integrated circuit 10 is also comprised of a processing element 14 connected to the sensor 12 which receives the sensor signal only from the sensor 12 and produces a processing signal corresponding to the sensor signal. There is also a memory 16 connected to the processing element 14 for receiving the processing signal and storing the processing signal. Preferably, the integrated circuit 10 is also comprised of a buffer 18 connected to the sensor 12 and the processing element 14 for receiving the sensor signal and buffering the sensor signal for reception by the processing element 14.

Figure 2:
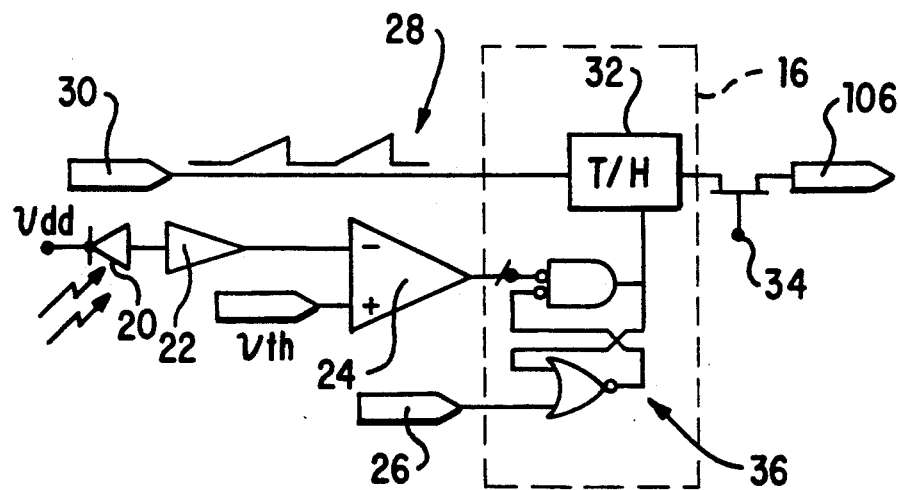
FIG. 2 is a schematic representation of an integrated circuit of a preferred embodiment of the present invention.

In a preferred embodiment, the integrated circuit 10 is able to detect and remember the time at which it observes a predetermined amount of light to which it is sensitive. Referring to FIG. 2, which is a schematic representation of a circuit of the preferred embodiment, the sensor 12 includes a photodiode 20 which produces the sensor signal corresponding to light energy it receives. The buffer 18 preferably includes a preamplifier 22 connected to the photodiode 20 to receive the sensor signal and boost its gain. The processing element 14 can include a comparator 24 which receives the sensor signal and produces the processing signal when the sensor signal corresponds to at least a predetermined light energy. In the preferred embodiment, the memory 16 can include a register 36 which stores the processing signal. There also can be means 28 for identifying when the photodiode 20 receives the light energy. The identifying means 28 can include a timestamp 30 which produces a timestamp signal. The memory 16 can then include a track-and-hold (T/H) circuit 32 which receives the timestamp signal and saves the time from the timestamp when the light energy is received by the photodiode 20. The integrated circuit 10 can also have the ability to remember a sensor signal value, for instance, the maximum light energy value that photodiode 20 receives over a given period of time.

Figure 3:
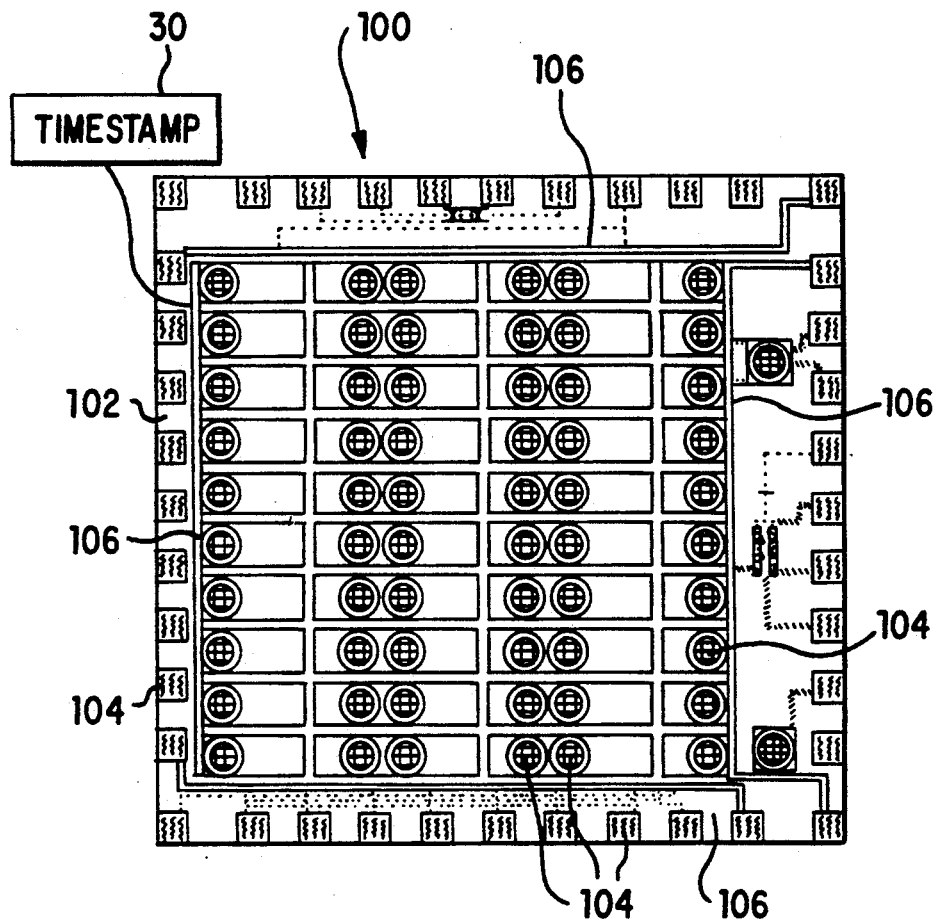
FIG. 3 is a layout of a 10×6 sensor array.

In another embodiment, an integrated circuit 100, as shown in FIG. 3, is comprised of a sensor array 102 that is comprised of N cells 104 each of which is able to detect and remember the time at which it observes a predetermined amount of light to which it is sensitive, and/or a value of energy which it receives and to which it is sensitive. N is greater than or equal to 2. Each cell 104 is preferably comprised of a sensor 12 which produces a sensor signal corresponding to energy it receives. Each cell is also comprised of a processing element 14 connected to the sensor 12 which receives only the sensor signal and produces a processing signal corresponding to the sensor signal. Each cell additionally is comprised of a memory 16 connected to the processing element for receiving the processing signals during the processing signal. Each cell 104 is essentially the integrated circuit 10 as is shown in FIG. 1.

Preferably, each cell 104 includes a buffer 18 connected to the sensor 12 and the processing element 14 for receiving the sensor signal and buffering the sensor signal for reception by the processing element. The sensor array 104 is preferably a photosensitive array wherein each sensor 12 of the array 102 includes a photodiode 20, as shown in FIG. 2, which produces a sensor signal corresponding to light energy it receives. Preferably, the buffer 18 in each cell 104 includes a preamplifier 22 connected to the photodiode 20 to receive the sensor signal and boost its gain. Each processing element 14 in each cell 104 is preferably a comparator 24 which receives the sensor signal only from the sensor 12 in the same cell 14 and produces the processing signal when the sensor signal corresponds to at least a predetermined light energy. Each memory 16 in each cell 104 includes a register 36, which stores the processing signal. A sensor signal value can also be stored in memory 16, such as the maximum intensity of light energy received over a given period of time.

Additionally, there can be means 28 for identifying when the photodiode 20 in a respective cell 104 receives the light energy. The identifying means 28 can include a timestamp 30 which produces a timestamp signal. Each memory 16 in each cell 104 then can include a track-and-hold (T/H) circuit 32 which receives the timestamp signal and saves the time from the timestamp signal when the light energy is received by the photodiode 20 in the cell 104. The integrated circuit 100 can also include a wire 106 to which the output of each track-and-hold circuit 32 is connected, as shown in FIG. 3. Each cell 104 includes an unload cell data switch 34 which, when activated, releases the data stored in the track-and-hold circuit 32 in the cell 104 onto the bus 106. Each cell 104 also can include a reset signal 26 connected to the flip-flop 36 which, when activated, resets the flip-flop 36.

Figure 4:
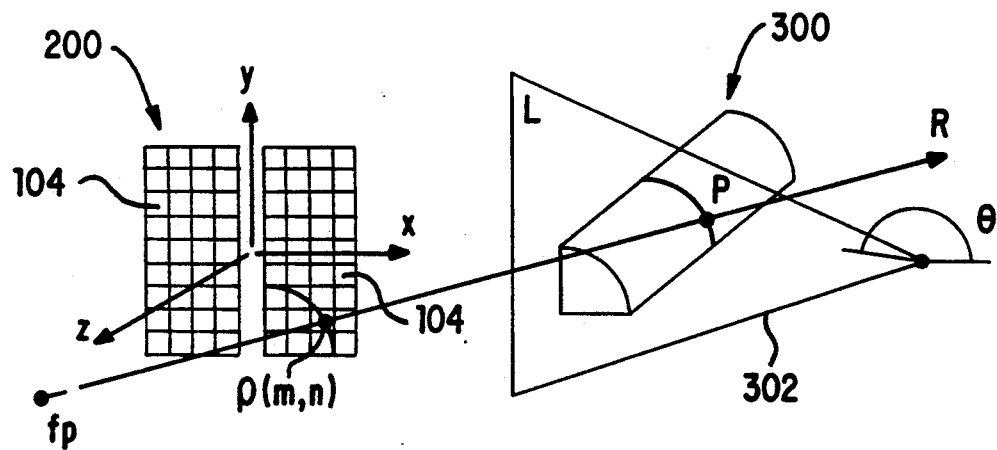
FIG. 4 is a schematic representation of lightstripe rangefinder geometry.

The sensor array 102 having photodiodes 20 can comprise a photosensitive array 200, as shown in FIG. 4, comprised of cells 104 each able to detect and remember the time in which it observes a predetermined light intensity thereon. The photosensitive array 200 can be used in a lightstripe rangefinder 300 wherein a plane of light 302 is moved across a scene. The photosensitive array 200 can be positioned such that each cell 104 of the photosensitive diode 200 predefines a unique line of sight, and the time information recorded by each cell 104 of the observed light intensity determines a particular orientation of the lightstripe. Preferably, the plane of light 302 is swept across the scene. The plane of light 302 is preferably swept across the scene at a constant angular velocity. By knowing when the predetermined light intensity is received by the cell and the orientation of the lightstripe that corresponds to the cell that receives the light intensity, the range of the surface from which the light is reflected can be determined by known triangulation techniques.

In the rangefinding technique of the present invention, a two-dimensional array 200 of photosensitive cells 104 is substituted for the video camera. In addition, range data is not acquired in a step-and-repeat manner. Instead, the plane of light 302 is swept across the scene at a constant angular velocity once from left to right.

Each cell 104 of the array 200 has circuitry that can detect and remember the time at which it observed preferably the peak incident light intensity during a sweep of the stripe L. Each cell of the array 200 predefines a unique line of sight R of the stripe $\theta_{lcell}$. Recalling the geometry in FIG. 4, this information is sufficient to calculate the three-dimensional position of the imaged object point P, again using triangulation. The data gathered during one pass of the stripe in each cell of an M×M array of these cells 104 is sufficient to calculate the M×M range map of an imaged scene.

For an M×M array of these cells 104, the sweep time $T_s$ of the lightstripe and M determine the sampling speed. The sweep time $T_s$ is limited by photoreceptor sensitivity and M by integration technology. $T_s$ can be on the order of one to ten milliseconds and values of M can range between 40 and 100. The rates at which the sensor array generates range data will be $$S_{max}^{Smart} = \frac{M^2}{T_s} \approx 0.2 \sim 10 \; M\text{samples/second}.$$

This is a speedup of a few orders of magnitude over that of a conventional camera-based system.

In addition, the resolution of the distance measurement also increases. In the basic method, the number of pixels in the horizontal scan line (typically 256 to 512) limits accuracy because the range information is derived from the position of the peak of the light intensity profile on the scan line. Thus, quite often subpixel peak localization techniques, which provide at most one tenth of a pixel spacing accuracy, are employed. It is interesting to note that since the accuracy relies on the interpolation of a spatially sampled profile, an extremely fine light stripe which provides a good x-y resolution, is not necessarily the best for obtaining z accuracy. In the present invention, however, the peak of the continuous uninterpolated time profile of intensity from the same cell is detected in the time domain with much greater accuracy. The spatial position of the light stripe is accurately determined by a shaft encoder of the light stripe projector. With the modified method, a fine light stripe directly contributes to an increase of both x-y resolution and z accuracy.

The photodiodes 20 are critical to the sensitivity and bandwidth of the sensor cells 104. Current output at a given incident light intensity is directly proportional to the photodiode 20 area. The more area devoted to photodiode 20 structures in an array, the better the optical sensitivity of the cells 104. Detectability of the stripe can also be enhanced at the system level by using a stripe source which emits light at a wavelength where silicon photoreceptors are most sensitive.

In a CMOS process, maximum sensitivity photodiodes 20 are built using the well-substrate junction. See M. Minou, T. Kanade and T. Sakai, "A method of time-coded parallel planes of light for depth measurement", Trans. IECE Japan, vol. J64-D, 8, 1981. With p-well CMOS, this vertical photodiode structure is construed using the n-type substrate as the cathode and the p-type well as the anode. An additional $p^+$ implant is driven into the well to reduce the surface resistivity of the anode to which contact is made. Finally, the photodiode 20 structures are surrounded with guard rings to help reduce the contribution of noise from other current in the substrate and to minimize the chance of photocurrent induced latchup. Only the anode of the photodiode is accessible for reversed biased operation. The cathode of the diode is the substrate and will be at the substrate voltage.

Figure 5:
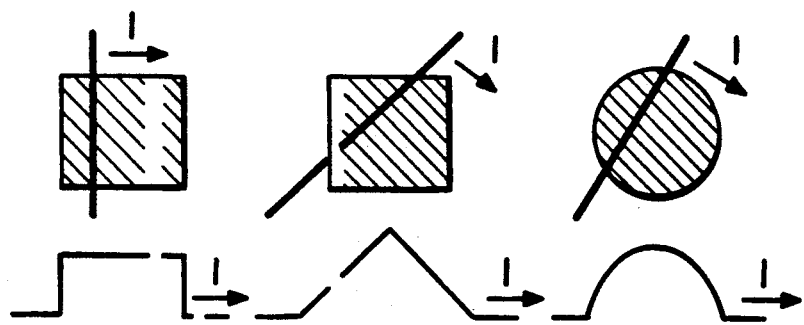
FIG. 5 is a schematic representation of photodiode area and corresponding pulse shape with respect to a lightstripe.

The shape of the photodiode 20 areas is important. Consider the image of a stripe moving across the photodiode as shown in FIG. 5. In the case of a square photocell, output pulse shape depends on stripe orientation— for a vertical stripe, the output pulse observed will be square, but a 45° stripe will produce a triangle wave. This difference in pulse shapes translates to a frequency characteristic which is a function of imaged surface orientation. The accuracy with which the time of peak signal amplitude can be determined will be affected by the phase differences changing pulse shapes represent. If photodiode areas are circular, pulse shape will be independent of stripe orientation.

Special care should be taken with the photodiode 20 amplification stages. Photocurrents induced by incident light from the stripe are on the order of a nanoamp and must be amplified to reasonable voltage levels. In addition, the high rate of range map acquisition supported by the system implies high bandwidth photodiode 20 signals. A 100×100 element sensor gathering 1,000 range images per second requires an amplifier that can provide gain out to 200 KHz.

Filtering of the sensor 12 or photodiode 20 signal may be advantageous. The frequency content of signals generated by a continuously moving stripe will be found above the base scanning frequency. Thus, the lowpass nature of amplified photocurrents should be combined with a highpass filter stage to yield an amplifier with an overall bandpass frequency response. The cells that result will be most sensitive to frequencies generated by the image of a moving stripe. The amount of interference caused by ambient light and signal conditioning circuitry 1/f noise will be reduced. More precise matching of filter characteristics to expected photocurrent pulse shapes carries this idea a step further and could further increase cell sensitivity to the lightstripe source.

On an integrated circuit, filters can be constructed in a reasonable amount of die area using switched capacitor techniques. See J. L. Posdamer and M. D. Altschuler, "Surface measurement by space-encoded projected beam systems", Computer Graphics and Image Processing, 18, 1, 1982. An SC circuit simulates a large valued resistance with an active circuit consisting of switches and a capacitor. However, any SC design requires a constantly running digital clock that has the potential to inject noise into the substrates and thus corrupt the delicate photocurrent measurements.

Another implementation detail affected by the choice of unclocked verses clocked circuitry is the comparator 24 design. Unclocked designs require the use of non-regenerative comparators 24—essentially an uncompensated two stage opamp circuit, see J. P. Rosenfeld and C. J. Tsikos, "High-speed space encoding projector for 3D imaging", Proc. SPIE 728, 146, 1986, pages 168–172, with no applied external feedback. A clocked cell 104 design allows the use of a regenerative comparator 24 topology. Regenerative comparators 24 use positive feedback when clocked making them faster and more accurate for a given circuit area than the nonregenerative variety.

A system timestamp, broadcast to each cell 104, could be represented in either one of two ways: as an analog voltage ramp or as the multi-bit value of a constantly running digital counter. Represented as a voltage, the time information would be held on the capacitor of a track-and-hold 32 (T/H) circuit when the latch in the cell 104 is tripped by the detection of the stripe. The equivalent memory in the digital scheme is a multibit latch.

Representing time in an analog form has several advantages over the digital equivalent. The analog-only scheme avoids noise problems associated with mixing sensitive analog circuitry with digital logic. A multi-bit digital timestamp bussed over the entire chip, combined with transients associated with the latching of timestamp values by sensing elements, is a source of noise with the potential to corrupt the photocurrent measurements. Of course, information stored in analog form is subject to corruption from sources like noise and voltage droop. Corruption from effects like these is not an issue for information represented in binary form.

The integrated circuit area needed for timestamp broadcast and latching will be smaller for the analog scheme when compared with the circuit area required by the digital scheme. An analog timestamp can be broadcast over the entire integrated circuit on a single wire and the circuitry to record an analog time value consists of a holding capacitor and a switch. The eight bits of digital timestamp necessary for 0.5% resolution would have to be broadcast over a bus and each cell 104 would need a eight bit latch.

In addition to the structures that can be built using a standard p-well CMOS process, the double-poly process provides high quality linear capacitors. These capacitors exhibit good matching across a die and are needed by cells 104 on the range sensor integrated circuit to store analog voltages. The matching of these capacitors across the integrated circuit will in large part determine the variance in voltage reported by individual photodiodes 20 for given time values. At capacitive densities of 0.5ff/$\mu$m$^2$, a 1pf T/H capacitor will be 45 $\mu$m on a side.

A block diagram of this integrated circuit, showing sensing element layout, can be seen in FIG. 3. Total sensing cell 104 area is roughly 300 $\mu$m $\times$ 150 $\mu$m.

A prototype rangefinding system using an integrated circuit sensor constructed out of a 6 $\times$ 10 array of photodiodes 20 has been designed and built. Essential components in this system included stripe generation hardware, integrated circuit range sensor, range sensor optics, and host interface.

The integrated circuit range sensor was mounted in a 35 mm camera body which provided a convenient mechanism for incorporating focusing optics and for sighting the rangefinder. Photodiodes 20 were chosen for the sensors 12 because they possess bandwidth sufficient to meet sweep rate specifications.

Figure 6:
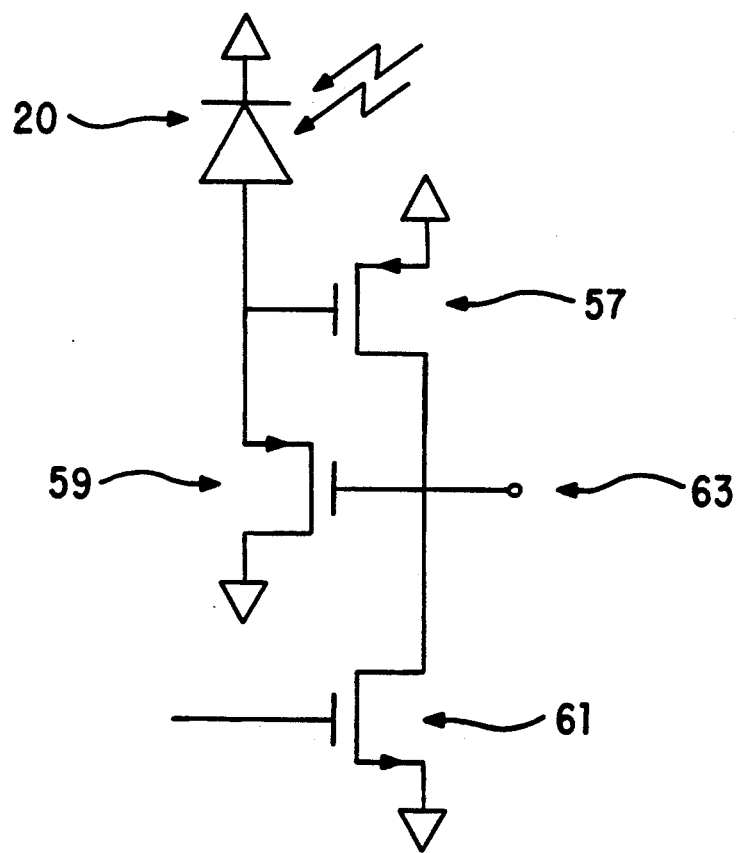
FIG. 6 is a schematic representation of a transimpedance amplifier.

The photocurrent amplification circuitry must provide a large photocurrent to voltage gain while minimizing the effect of the internal photodiode capacitance on bandwidth. The preamplifier 22 can be a transimpedance amplifier as shown in FIG. 6. The transimpedance amplifier provides a large current to voltage gain and a small impedance. In the operation of the transimpedance amplifier, current from photodiode 20 is forced through first MOSFET 59 barely turning it on, thus giving the current a large impedance to work against. The varying current working against this impedance creates a varying voltage which is amplified and output by the combination of the second MOSFET 57 and the third MOSFET 61 at output 63. Negative feedback keeps the MOSFETS biased properly.

The stripe in this discrete implementation was generated using a 5 mW helium-neon (HeNe) laser and half-cylindrical lens. A mirror mounted on a galvonometer provided the means to sweep the stripe. Two scans (one from left-to-right, the other from right-to-left) were generated during each period of a 500 Hz triangle wave used to drive the galvonometer, providing the system with the desired 1,000 sweeps per second.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. An integrated circuit comprising:
    a sensor which produces a sensor signal corresponding to energy it receives;
    a processing element connected to the sensor which receives the sensor signal only from the sensor and produces a processing signal corresponding to the sensor signal and a second signal; and
    a memory connected to the processing element for receiving the processing signal and storing the processing signal.

2. An integrated circuit as described in claim 1 including a buffer connected to the sensor and the processing element for receiving the sensor signal and buffering the sensor signal for reception by the processing element.

3. An integrated circuit as described in claim 2 wherein the sensor includes a photodiode which produces the sensor signal corresponding to light energy it receives.

4. An integrated circuit as described in claim 3 wherein the buffer includes a preamplifier connected to the photodiode to receive the sensor signal and boost its gain.

5. An integrated circuit as described in claim 4 wherein the processing element includes a comparator which receives the sensor signal and produces the processing signal when the sensor signal corresponds to at least a predetermined light energy.

6. An integrated circuit as described in claim 5 wherein the memory includes a register which stores the processing signal; and the integrated circuit includes means for identifying when the photodiode receives the light energy, said identifying means in communication with said sensor.

7. An integrated circuit as described in claim 6 wherein the identifying means includes a timestamp which produces a timestamp signal; and wherein the register is a track and hold circuit which receives the timestamp signal and saves the time from the timestamp signal when the light energy is received by the photodiode.

8. An integrated circuit as described in claim 1 wherein the processing element includes a filter which enhances the sensor signal.

9. An integrated circuit as described in claim 1 including means for producing a second signal to the processing element, said producing means connected to the processing element.

10. An integrated circuit as described in claim 9 wherein the producing means includes a pin for providing the second signal to the processing element.

11. An integrated circuit comprising:
a sensor array, said sensor array comprising N cells where $N \geq 2$, each cell comprised of:
a sensor which produces a sensor signal corresponding to energy it receives;
a processing element connected to a corresponding sensor which receives the sensor signal only from the corresponding sensor in the cell and produces a processing signal corresponding to the sensor signal and a second signal; and
a memory connected to the processing element for receiving the processing signal and storing the processing signal.

12. An integrated circuit as described in claim 11 including a bus in communication with each cell for data transfer.

13. An integrated circuit as described in claim 11 wherein each processing element includes a filter which enhances of the corresponding sensor signal.

14. An integrated circuit as described in claim 11 including means for producing a second signal to the processing element, said producing means connected to the processing element.

15. An integrated circuit as described in claim 14 wherein each cell includes a buffer connected to the sensor and the processing element for receiving the sensor signal and buffering the sensor signal for reception by the processing element.

16. An integrated circuit as described in claim 15 wherein each sensor includes a photodiode which produces the sensor signal corresponding to light energy it receives.

17. An integrated circuit as described in claim 16 wherein each buffer includes a preamplifier connected to the photodiode to receive the sensor signal and boost its gain.

18. An integrated circuit as described in claim 17 wherein each processing element is a comparator which receives the sensor signal and produces the processing signal when the sensor signal corresponds to at least a predetermined light energy.

19. An integrated circuit as described in claim 18 wherein each memory includes a register which stores the processing signal; and each cell includes means for identifying when the photodiode receives the light energy, said identifying means in communication with said corresponding sensor.

20. An integrated circuit as described in claim 19 wherein the identifying means includes a timestamp which produces a timestamp signal; and wherein each register of each cell includes a track and hold circuit which receives the timestamp signal and saves the time from the timestamp signal when the light energy is received by the photodiode.

21. An integrated circuit sensor array so described in claim 11 wherein each of the cells is able to detect and store the time at which it observes a predetermined amount of energy to which it is sensitive.

22. An integrated circuit as described in claim 21 wherein the sensor includes a photodiode which produces the sensor signal corresponding to light energy it receives.

23. An integrated circuit as described in claim 22 wherein the buffer includes a preamplifier connected to the sensor to receive the sensor signal and boost its gain.

24. An integrated circuit as described in claim 23 wherein the processing element includes a comparator which receives the sensor signal and produces the processing signal when the sensor signal corresponds to at least a predetermined energy.

25. An integrated circuit as described in claim 24 wherein the memory includes a register which stores the processing signal.

26. An integrated circuit as described in claim 22 including means for identifying when the photodiode receives the light energy.

27. An integrated circuit as described in claim 26 wherein the identifying means includes a timestamp which produces a timestamp signal; and wherein the register is a track and hold circuit which receives the timestamp signal and saves the time from the timestamp signal when the light energy is received by the photodiode.

28. An integrated circuit as described in claim 27 wherein the memory includes digital data storage means.

29. An integrated circuit as described in claim 27 wherein the memory includes analog data storage means.

30. A rangefinder which uses a photosensitive array on an integrated circuit to derive range information from an object to a reference point with a tailored light source, said photosensitive array comprising N cells where $N \geq 2$, each cell comprised of:
a sensor which produces a sensor signal corresponding to energy it receives;
a processing element connected to the sensor which receives the sensor signal only from the sensor in the same cell and produces a processing signal corresponding to the sensor signal and a second signal; and
a memory connected to the processing element for receiving the processing signal and storing the processing signal.

31. An integrated circuit sensor array as described in claim 30 wherein each of the cells is able to detect and store a value of energy which it receives and to which it is sensitive.

32. An integrated circuit as described in claim 30 wherein each sensor includes a photodiode which produces the sensor signal corresponding to light energy it receives.

33. An integrated circuit as described in claim 32 wherein each cell includes a buffer connected to the sensor and the processing element for receiving the sensor signal and buffering the sensor signal for reception by the processing element.

34. An integrated circuit as described in claim 33 wherein each buffer includes a preamplifier connected to the sensor to receive the sensor signal and boost its gain.

35. An integrated circuit as described in claim 30 wherein each processing element is a comparator which receives the sensor signal and produces the processing signal when the sensor signal corresponds to at least a predetermined energy.

36. An integrated circuit as described in claim 35 wherein each memory includes a register which stores the processing signal.

37. An integrated circuit as described in claim 35 wherein the sensor includes a photodiode which produces the sensor signal corresponding to light energy it receives; and including means for identifying when the photodiode receives the light energy.

38. An integrated circuit as described in claim 37 wherein the identifying means includes a timestamp which produces a timestamp signal; and wherein each register is a track and hold circuit which receives the timestamp signal and saves the time from the timestamp signal when the light energy is received by the photodiode.

39. An integrated circuit as described in claim 33 wherein each memory includes digital data storage means.

40. An integrated circuit as described in claim 33 wherein each memory includes analog data storage means.

41. An integrated circuit as described in claim 33 wherein each cell remembers a sensor signal value from its corresponding sensor.

42. An integrated circuit as described in claim 30 wherein each cell includes a buffer connected to the sensor and the processing element for receiving the sensor signal and buffering the sensor signal for reception by the processing element.

43. An integrated circuit as described in claim 42 wherein each sensor includes a photodiode which produces the sensor signal corresponding to light energy it receives.

44. An integrated circuit as described in claim 43 wherein each buffer includes a preamplifier connected to the photodiode to receive the sensor signal and boost its gain.

45. An integrated circuit as described in claim 44 wherein each processing element is a comparator which receives the sensor signal and produces the processing signal when the sensor signal corresponds to at least a predetermined light energy.

46. An integrated circuit as described in claim 45 wherein each memory includes a register which stores the processing signal; and each cell includes means for identifying when the photodiode receives the light energy, said identifying means in communication with said corresponding sensor.

47. An integrated circuit as described in claim 46 wherein the identifying means includes a timestamp which produces a timestamp signal; and wherein each register of each cell includes a track and hold circuit which receives the timestamp signal and saves the time from the timestamp signal when the light energy is received by the photodiode.

48. A rangefinder as described in claim 30 including means for producing a second signal to the processing element, said producing means connected to the processing element.

49. An integrated circuit comprising:
 a sensor which produces a sensor signal corresponding to energy it receives;
 a processing element connected to the sensor which receives the sensor signal only from the sensor and produces a processing signal corresponding to the sensor signal; and
 a memory connected to the processing element for receiving the processing signal and storing some aspect of the processing signal other than the sensor signal.

50. An integrated circuit as described in claim 49 including a buffer connected to the sensor and the processing element for receiving the sensor signal and buffering the sensor signal for reception by the processing element.

51. An integrated circuit as described in claim 50 wherein the sensor includes a photodiode which produces the sensor signal corresponding to light energy it receives.

52. An integrated circuit as described in claim 51 wherein the buffer includes a preamplifier connected to the photodiode to receive the sensor signal and boost its gain.

53. An integrated circuit as described in claim 52 wherein the processing element includes a comparator which receives the sensor signal and produces the processing signal when the sensor signal corresponds to at least a predetermined light energy.

54. An integrated circuit as described in claim 53 wherein the memory includes a register which stores the processing signal; and there is means for identifying when the photodiode receives the light energy.

55. An integrated circuit as described in claim 54 wherein the identifying means includes a timestamp which produces a timestamp signal; and wherein the register is a track and hold circuit which receives the timestamp signal and saves the time from the timestamp signal when the light energy is received by the photodiode.

* * * * *